United States Patent
Wang et al.

(10) Patent No.: US 7,679,187 B2
(45) Date of Patent: Mar. 16, 2010

(54) BONDING PAD STRUCTURE FOR BACK ILLUMINATED OPTOELECTRONIC DEVICE AND FABRICATING METHOD THEREOF

(75) Inventors: Kai-Chih Wang, Taoyuan (TW); Fang-Chang Liu, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 0 days.

(21) Appl. No.: 11/652,095

(22) Filed: Jan. 11, 2007

(65) Prior Publication Data
US 2008/0169117 A1    Jul. 17, 2008

(51) Int. Cl.
*H01L 23/48* (2006.01)
*H01L 23/52* (2006.01)
*H01L 29/40* (2006.01)

(52) U.S. Cl. .................. 257/734; 257/758; 257/772; 257/779; 257/E23.015; 257/E25.032

(58) Field of Classification Search ............. 257/734, 257/772–779, E23.015, E25.032, E23.02, 257/459, E23.023
See application file for complete search history.

(56) References Cited

U.S. PATENT DOCUMENTS

| | | | |
|---|---|---|---|
| 6,177,707 B1 * | 1/2001 | Dekker et al. | 257/347 |
| 2003/0132497 A1 * | 7/2003 | Chen et al. | 257/459 |
| 2005/0104148 A1 | 5/2005 | Yamamoto et al. | |
| 2007/0164449 A1 * | 7/2007 | Wang | 257/778 |

* cited by examiner

*Primary Examiner*—Cuong Q Nguyen
*Assistant Examiner*—Cathy N Lam
(74) *Attorney, Agent, or Firm*—Muncy, Geissler, Olds & Lowe, PLLC

(57) ABSTRACT

A bonding pad structure for an optoelectronic device. The bonding pad structure comprises a carrier substrate having a bonding pad region and an optoelectronic device region. An insulating layer is disposed on the carrier substrate, having an opening corresponding to the bonding pad region. A bonding pad is embedded in the insulating layer under the opening to expose the top surface thereof. A device substrate is disposed on the insulating layer corresponding to the optoelectronic device region. A cap layer covers the device substrate and the insulating layer excluding the opening. A conductive buffer layer is disposed in the opening to directly contact the bonding pad. The invention also discloses a method for fabricating the same.

11 Claims, 6 Drawing Sheets

BONDING PAD STRUCTURE FOR BACK ILLUMINATED OPTOELECTRONIC DEVICE AND FABRICATING METHOD THEREOF

BACKGROUND OF THE INVENTION

1. Field of the Invention

The invention relates to optoelectronic devices and in particular to a bonding pad structure for an optoelectronic device and fabricating method thereof.

2. Description of the Related Art

Digital image devices are widely used in, for example, digital cameras, digital video recorders, cellular phones with image capture function, and monitors. A digital imaging sensor typically includes an optoelectronic device chip, such as a charge-coupled device (CCD) image sensor chip and CMOS image sensor chip.

Such an image sensor chip typically comprises metal structures used as electrodes for picture elements and as bonding pads for electrical connection with external circuits. The metal structure is formed by known damascene process and metallization. A barrier layer is typically formed prior to metal filling. That is, the barrier layer is formed on the bottom surfaces and sidewalls of the metal structures. However, the atoms of the barrier layer may diffuse into the bottom surfaces and sidewalls of the metal structures during performing thermal process in device fabrication.

In a back-illuminated image sensor, the image sensor chip comprises a device substrate having micro-electronic devices formed thereon, and reversely mounted on a carrier substrate or a protective substrate. Since the device substrate is reversely placed, portions of the device substrate must be removed to expose the metal structures serving as bonding pads for subsequent wire bonding process. However, as the device substrate is reversely arranged on the carrier substrate and partially removed to expose the bonding pads, the bonding wire may contact the surface of the bonding pad with impurities diffusing from the barrier layer, resulting in poor adhesion between the bonding wires and the bonding pads. Poor adhesion between the bonding wire and the bonding pad may reduce package reliability and cause device failure.

Thus, there exists a need for a bonding pad structure for an optoelectronic device with enhanced bonding pad adhesion.

BRIEF SUMMARY OF THE INVENTION

A detailed description is given in the following embodiments with reference to the accompanying drawings. Bonding pad structures for an optoelectronic devices and methods for fabricating the same are provided. An embodiment of a bonding pad structure for an optoelectronic device comprises a carrier substrate having a bonding pad region and an optoelectronic device region. An insulating layer is disposed on the carrier substrate, having an opening corresponding to the bonding pad region. At least one bonding pad is embedded in the insulating layer under the opening to expose the top surface thereof. A device substrate is disposed on the insulating layer corresponding to the optoelectronic device region. A cap layer covers the device substrate and the insulating layer excluding the opening. A conductive buffer layer is disposed in the opening to directly contact the bonding pad.

Another embodiment of a bonding pad structure for an optoelectronic device comprises a carrier substrate having a bonding pad region and an optoelectronic device region. An insulating layer is disposed on the carrier substrate, having an opening corresponding to the bonding pad region. At least one metal pad with no barrier layers formed thereon is embedded in the insulating layer under the opening to expose the top surface thereof. A device substrate is disposed on the insulating layer corresponding to the optoelectronic device region.

An embodiment of a method for fabricating a bonding pad structure for an optoelectronic device comprises providing an optoelectronic device reversely placed on a carrier substrate having a bonding pad region and an optoelectronic device region, wherein the optoelectronic device comprises a device substrate, an insulating layer disposed between the carrier substrate and the device substrate, and at least one bonding pad embedded in the insulating layer corresponding to the bonding pad region. The device substrate corresponding to the bonding pad region is removed. A cap layer is formed on the device substrate corresponding to the optoelectronic device region and the insulating layer corresponding to the bonding pad region. The cap layer and the underlying insulating layer are successively etched to form an opening exposing the bonding pad. A conductive buffer layer is formed in the opening to directly contact the bonding pad.

Another embodiment of a method for fabricating a bonding pad structure for an optoelectronic device comprises providing an optoelectronic device reversely placed on a carrier substrate having a bonding pad region and an optoelectronic device region, wherein the optoelectronic device comprises a device substrate, an insulating layer disposed between the carrier substrate and the device substrate, and at least one metal pad with no barrier layers formed thereon, embedded in the insulating layer corresponding to the bonding pad region. The device substrate corresponding to the bonding pad region is removed. The insulating layer is etched to form an opening exposing the metal pad.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
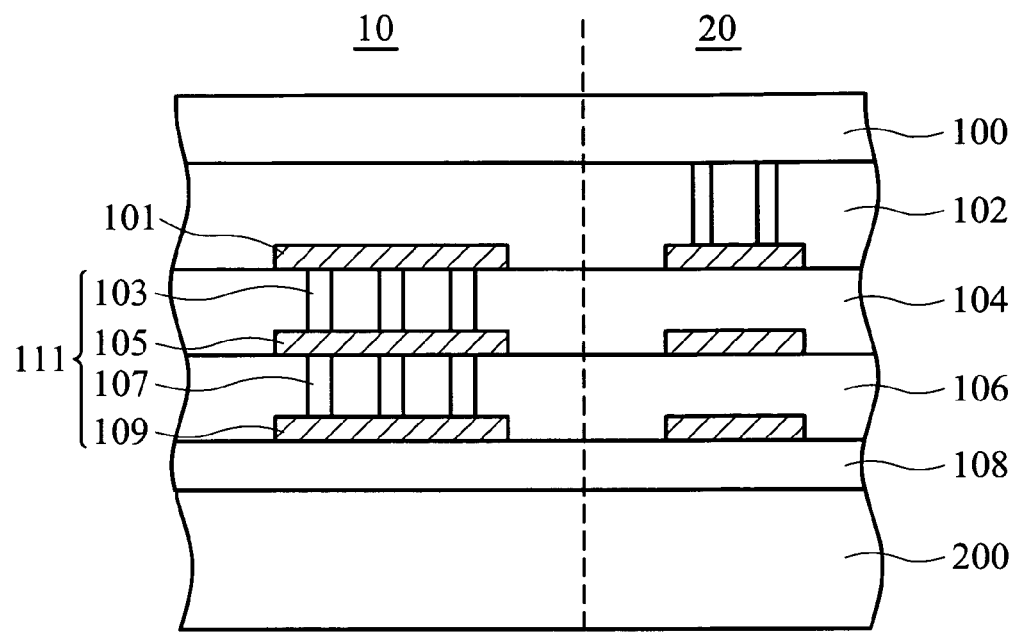
FIGS. 1A to 1C are cross sections of an embodiment of a method for fabricating a bonding pad structure for a back-illuminated optoelectronic device.

The following description is of the best-contemplated mode of carrying out the invention. This description is provided for the purpose of illustrating the general principles of the invention and should not be taken in a limiting sense. The scope of the invention is best determined by reference to the appended claims.

The invention relates to a bonding pad structure for an optoelectronic device and a method for fabricating the same. FIG. 1C illustrates an embodiment of a bonding pad structure for an optoelectronic device, such as a back-illuminated image sensor. The bonding pad structure comprises a carrier substrate 200, such as a silicon substrate, having a bonding pad region 10 and an optoelectronic device region 20. An insulating layer is disposed on the carrier substrate 200, having an opening 204 corresponding to the bonding pad region 10. In this embodiment, the insulating layer comprises dielectric layers 108, 106, 104 and 102 successively disposed on the carrier substrate 200.

A bonding pad 101 is embedded in the dielectric layer 102 under the opening 204 to expose the top surface thereof. Moreover, a multi-level interconnect structure 111 is optionally embedded in the insulating layer under the bonding pad 101, comprising metal layers 105 and 109 respectively embedded in the dielectric layers 104 and 106 and conductive plugs 103 and 107 electrically connected between the bonding pad 101 and the metal layer 105 and between the metal layers 105 and 109, respectively.

A device substrate 100, such as silicon substrate, is disposed on the insulating layer corresponding to the optoelectronic device region 20.

Figure 1B:
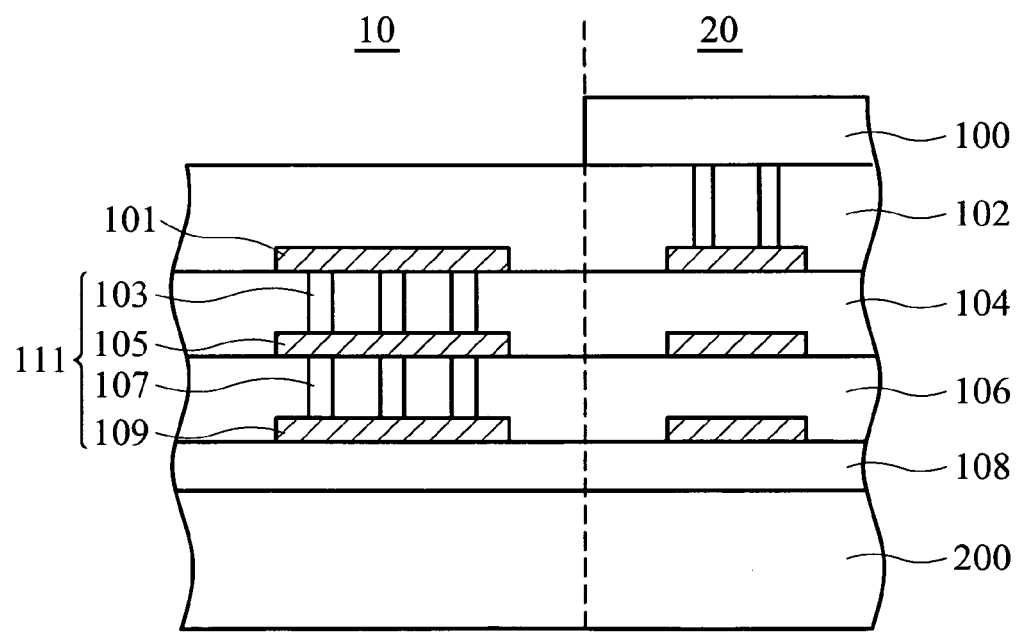
Figure 1C:
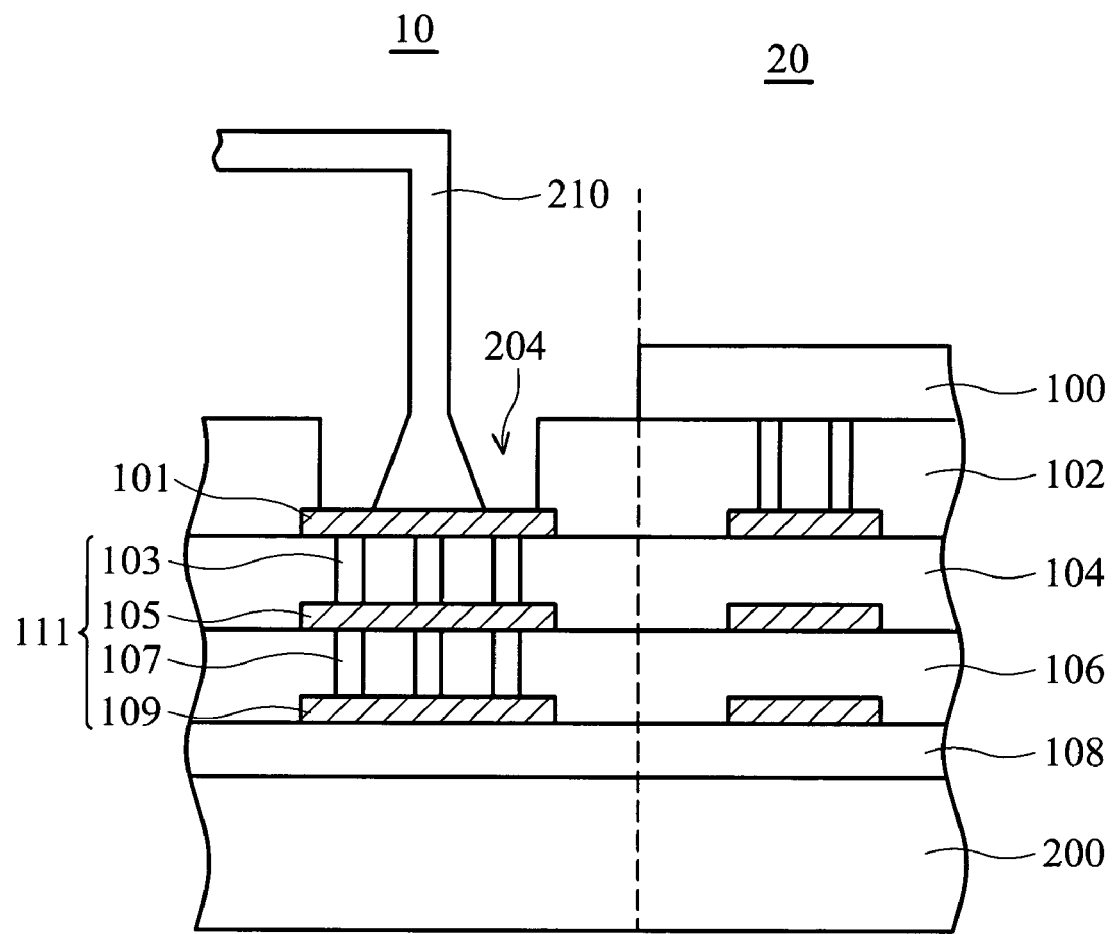
Figure 3A:
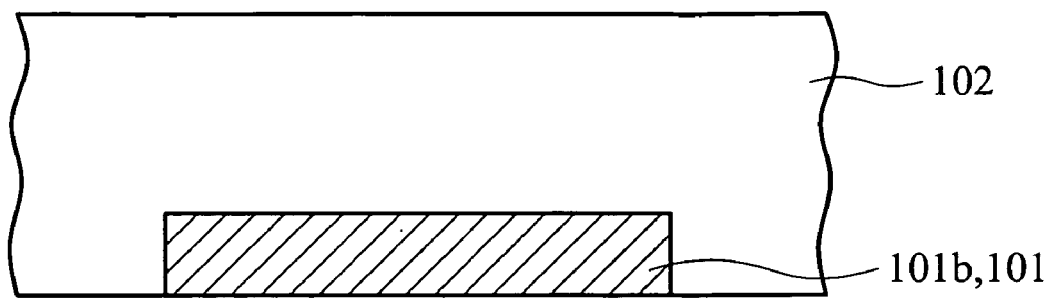
FIGS. 3A and 3B are magnifying diagrams of the bonding pad showing in FIG. 1A or 2A.

FIGS. 1A to 1C are cross sections of an embodiment of a method for fabricating a bonding pad structure for an optoelectronic device. As shown in FIG. 1A, an optoelectronic device, such as a back-illuminated image sensor, is provided. The optoelectronic device is reversely mounted on a carrier substrate 200 having a bond pad region 10 and an optoelectronic device region 20. In this embodiment, the carrier substrate 200 may comprise silicon or other semiconductor materials. Moreover, the optoelectronic device comprises a device substrate 100, such as a silicon substrate or other semiconductor substrate. The device substrate 100 may contain a variety of elements, including, for example, transistors, resistors, and other semiconductor elements as are well known in the art. The device substrate 100 may also contain conductive layers, insulating layers or isolation structures. The conductive layer is typically a layer comprising metal, such as copper, commonly used in the semiconductor industry for wiring the discrete optoelectronic devices, such as image sensors, in and on the substrate. In order to simplify the diagram, a flat substrate is depicted. An insulating layer is disposed on the device substrate 100. In this embodiment, the insulating layer comprises dielectric layers 102, 104, 106 and 108 successively disposed on the device substrate 100. The dielectric layer 102 may comprise silicon oxide or other low k materials, such as fluorinated silicate glass (FSG), carbon doped oxide, methyl silsesquioxane (MSQ), hydrogen silsesquioxane (HSQ), or fluorine tetra-ethyl-orthosilicate (FTEOS) and serve as an interlayer dielectric (ILD) layer. The other dielectric layers 104, 106 and 108 may comprise the same or similar material as the dielectric layer 102 and serve as inter-metal dielectric (IMD) layers. A bonding pad 101 is formed in the dielectric layer 102. Moreover, a multi-level interconnect structure 111 is formed under the bonding pad 101, comprising metal layers 105 and 109 respectively formed in the dielectric layers 104 and 106 and conductive plugs 103 and 107 electrically connected between the bonding pad 101 and the metal layer 105 and between the metal layers 105 and 109, respectively. In this embodiment, the bonding pad 101 consists of a metal layer 101b, such as copper or aluminum, with no barrier layers formed thereon, as shown in FIG. 3A.

As shown in FIG. 1B, the device substrate 100 corresponding to the bond pad region 10 is removed by conventional etching, to expose the ILD layer 102. Next, the exposed ILD layer 102 is etched to form an opening 204 therein exposing the bond pad 101, as shown in FIG. 1C. Thus, a bond pad structure of the invention is completed. Thereafter, a bonding wire 210 is directly formed on the bond pad 101 by conventional wire bonding.

According to this embodiment, since there is no barrier layers formed on the bond pad, the barrier layer diffusion problem can be prevented, thereby eliminating adhesion deterioration between the bond pad 101 and the bonding wire 210. Accordingly, the package reliability can be increased.

Figure 2A:
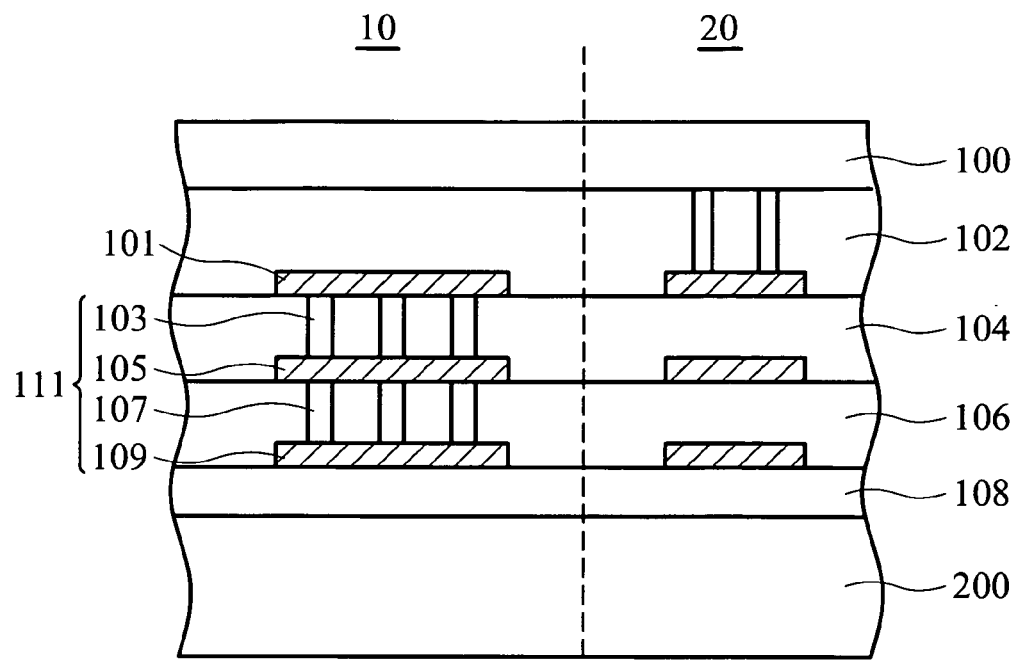
FIGS. 2A to 2E are cross sections of an embodiment of a method for fabricating a bonding pad structure for a back-illuminated optoelectronic device.
Figure 2B:
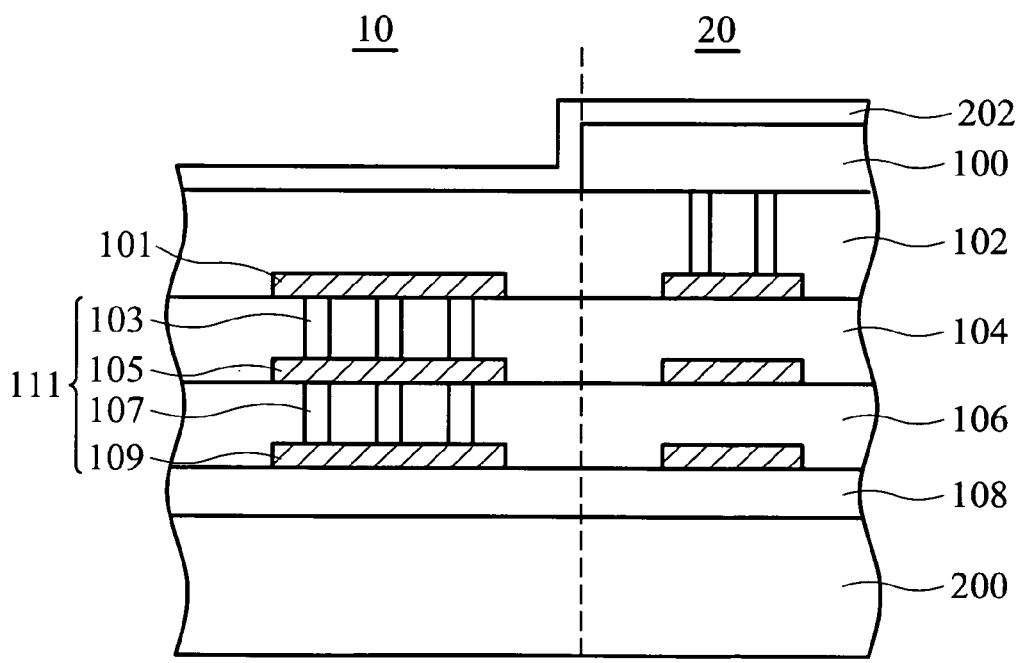
Figure 2C:
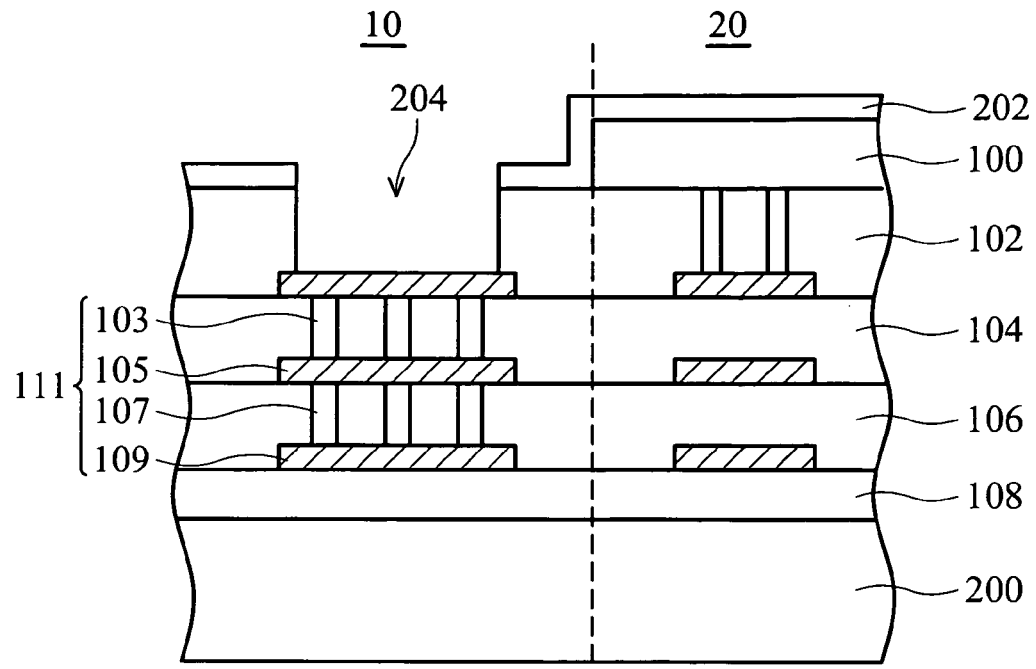
Figure 2D:
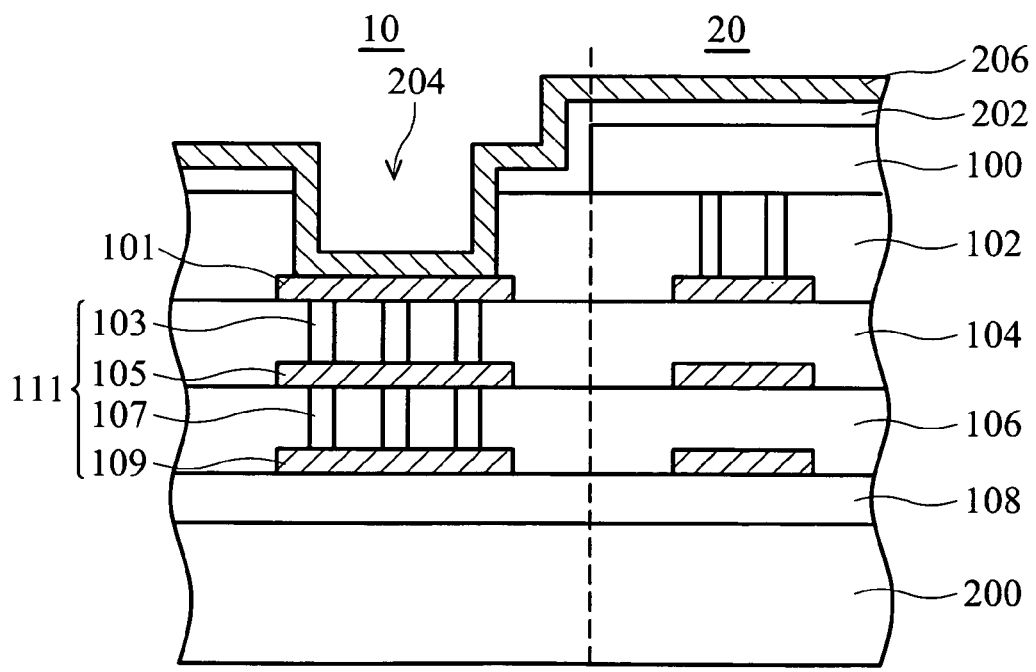
Figure 2E:
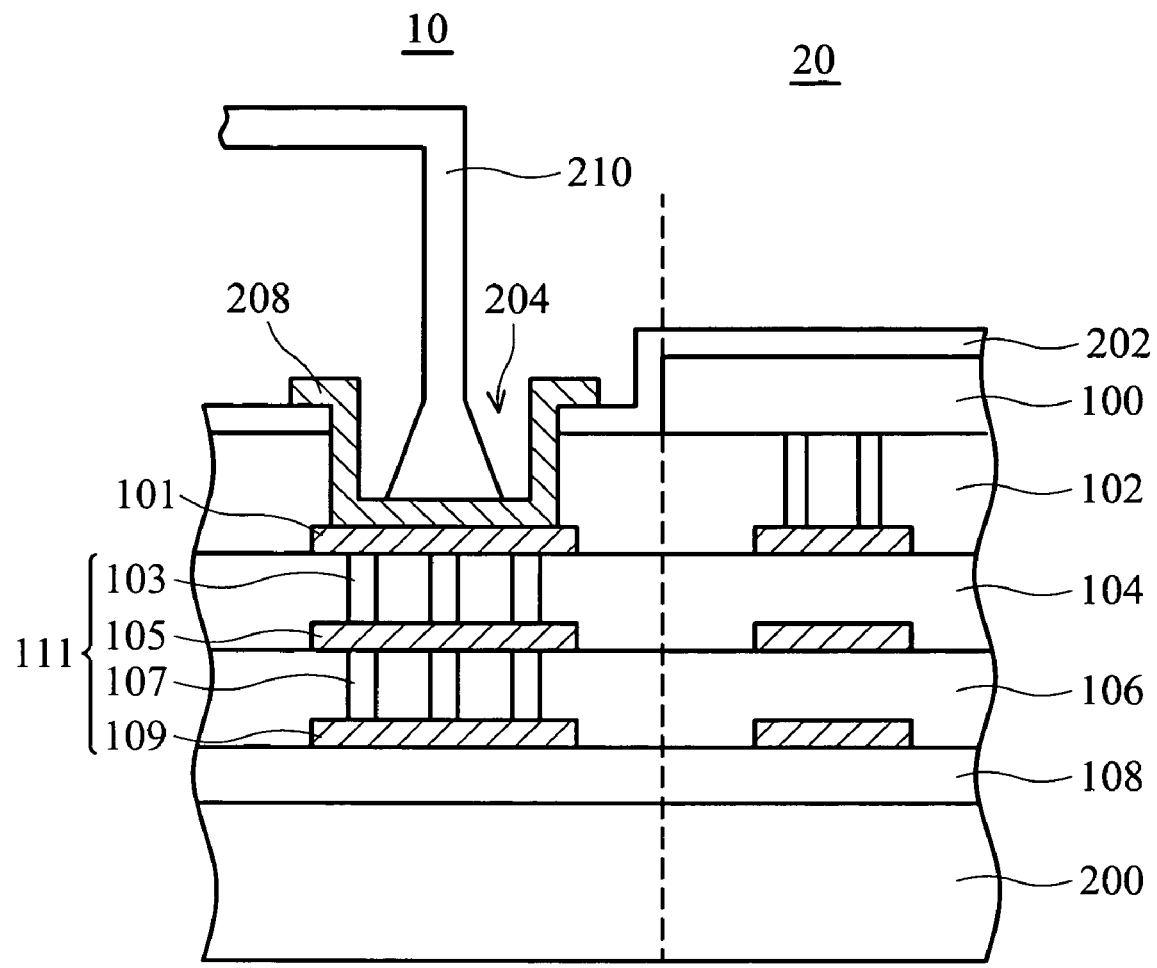

FIG. 2E illustrates another embodiment of a bonding pad structure for an optoelectronic device. Elements in FIG. 2E the same as in FIG. 1C are labeled the same and are not described again. A cap layer 202 covers the device substrate 100 and the dielectric layer 102 excluding the opening 204.

A conductive buffer layer 208 is conformally disposed on the bottom and sidewall of the opening 204 to directly contact the exposed bonding pad 101, serving as an electrical connection between a bonding wire 210 and the bonding pad 101. In this embodiment, the conductive buffer layer 208 may comprise metal, such as copper, aluminum or gold, or glue, such as Au glue or Ag glue, providing a contact area for wire bonding instead of the bonding pad 101 thereunder.

Figure 3B:
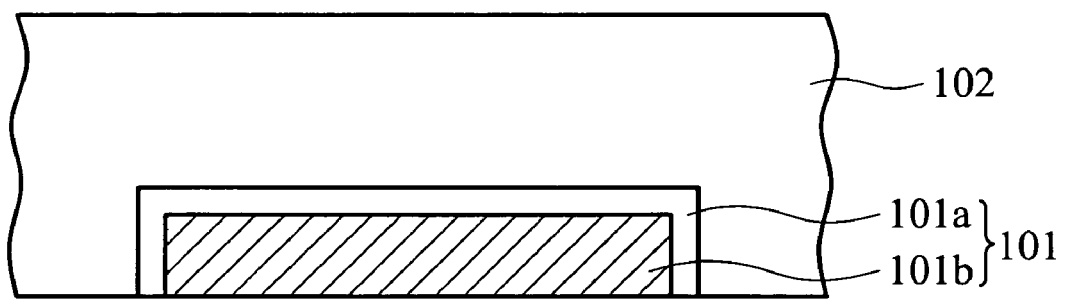

FIGS. 2A to 2E are cross sections of another embodiment of a method for fabricating a bonding pad structure for an optoelectronic device. Elements in FIGS. 2A to 2E the same as in FIG. 1A to 1C are labeled the same and are not described again. As shown in FIG. 2A, an optoelectronic device, such as a back-illuminated image sensor, is provided. The optoelectronic device is reversely mounted on a carrier substrate 200. Unlike the embodiment shown in FIGS. 1A to 1C, the bonding pad 101 may comprise a metal layer 101b and a barrier layer 101a formed thereon, as shown in FIG. 3B. Also, the bonding pad 101 may only include the metal layer 101b with no barrier layers formed thereon, as shown in FIG. 3A.

As shown in FIG. 2B, the device substrate 100 corresponding to the bond pad region 10 is removed by conventional etching, to expose the ILD layer 102. Next, a cap layer 202 is formed on the device substrate 100 and the exposed dielectric layer 102 by conventional deposition, such as chemical vapor deposition (CVD). In this embodiment, the cap layer 202 may be an insulating layer comprises oxide or antireflection coating (ARC) material.

As shown in FIG. 2C, the cap layer 202 and ILD layer 102 corresponding to the bond pad region 10 are successively etched to form an opening 204 therein exposing the bond pad 101.

As shown in FIG. 2D, a conductive buffer layer 206 is conformally disposed on the cap layer 202 and the bottom and the sidewall of the opening 204 to directly contact the exposed bonding pad 101. In this embodiment, the conductive buffer layer 206 may comprise metal, such as copper, aluminum or gold, formed by sputtering, CVD or other depositions. In some embodiments, the conductive buffer layer 206 may comprise conductive glue, such as Au glue or Ag glue, formed by coating.

As shown in FIG. 2E, the conductive buffer layer 206 is patterned to leave a portion of the conductive buffer layer 208 on the bottom surface and the sidewall of the opening 204 and partially extending on the top surface of the cap layer 202 corresponding to the bond pad region 10. Thus, a bond pad structure of the invention is completed. Thereafter, a bonding wire 210 is directly formed on the conductive buffer layer 206 by conventional wire bonding.

According to this embodiment, adhesion between a bonding wire 210 and the bonding pad 101 can be enhanced by an additional conductive layer disposed therebetween, thus the package reliability can be increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bonding pad structure for an optoelectronic device, comprising:
   a carrier substrate having a bonding pad region and an optoelectronic device region;
   an insulating layer disposed on the cater substrate, having an opening corresponding to the bonding pad region;
   at least one bonding pad embedded in the insulating layer under the opening to expose a top surface thereof;
   a semiconductor substrate disposed on the insulating layer corresponding to the optoelectronic device region;
   a cap layer covering the semiconductor substrate and the insulating layer excluding the opening; and
   a conductive buffer layer disposed in the opening to directly contact the bonding pad.

2. The bonding pad structure as claimed in claim 1, wherein the bonding pad comprises a metal layer and a barrier layer formed thereon.

3. The bonding pad structure as claimed in claim 1, wherein the bonding pad comprises a metal layer with no barrier layers formed thereon.

4. The bonding pad structure as claimed in claim 1, wherein the cater substrate and the semiconductor substrate comprise silicon.

5. The bonding pad structure as claimed in claim 1, wherein the cap layer comprises an anti-reflection coating material or oxide.

6. The bonding pad structure as claimed in claim 1, wherein the conductive buffer layer comprises metal or conductive glue.

7. The bonding pad structure as claimed in claim 1, further comprising a multi-level interconnect disposed in the insulating layer under the bonding pad and electrically connected thereto.

8. The bonding pad structure as claimed in claim 1, wherein the conductive buffer layer comprises copper, aluminum, or gold.

9. A bonding pad structure for an optoelectronic device, comprising:
   a carrier substrate having a bonding pad region and an optoelectronic device region;
   an insulating layer disposed on the carrier substrate, having an opening corresponding to the bonding pad region;
   at least one metal pad with no barrier layers formed thereon, embedded in the insulating layer under the opening to expose a top surface thereof; and
   a semiconductor substrate disposed on the insulating layer corresponding to the optoelectronic device region.

10. The bonding pad structure as claimed in claim 9, wherein the carrier substrate and the semiconductor substrate comprise silicon.

11. The bonding pad structure as claimed in claim 9, further comprising a multi-level interconnect disposed in the insulating layer under the metal pad and electrically connected thereto.

* * * * *